United States Patent
Gopinath et al.

(10) Patent No.: US 9,391,270 B1
(45) Date of Patent: Jul. 12, 2016

(54) MEMORY CELLS WITH VERTICALLY INTEGRATED TUNNEL ACCESS DEVICE AND PROGRAMMABLE IMPEDANCE ELEMENT

(71) Applicant: Adesto Technologies Corporation, Sunnyvale, CA (US)

(72) Inventors: Venkatesh P. Gopinath, Fremont, CA (US); Jeffrey Allan Shields, Sunnyvale, CA (US); Yi Ma, Santa Clara, CA (US); Chakravarthy Gopalan, Santa Clara, CA (US); Ming Kwon, Sunnyvale, CA (US); John Dinh, Dublin, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 14/530,460

(22) Filed: Oct. 31, 2014

(51) Int. Cl.
*H01L 45/00* (2006.01)
*H01L 27/24* (2006.01)

(52) U.S. Cl.
CPC ........ *H01L 45/1233* (2013.01); *H01L 27/2409* (2013.01); *H01L 27/2454* (2013.01); *H01L 45/08* (2013.01); *H01L 45/141* (2013.01); *H01L 45/146* (2013.01)

(58) Field of Classification Search
CPC .. H01L 45/08; H01L 45/1233; H01L 45/1266
See application file for complete search history.

(56) References Cited

U.S. PATENT DOCUMENTS

| | | | |
|---|---|---|---|
| 5,761,115 A | 6/1998 | Kozicki et al. | |
| 6,418,049 B1 | 7/2002 | Kozicki et al. | |
| 6,469,364 B1 | 10/2002 | Kozicki | |
| 6,753,561 B1* | 6/2004 | Rinerson | G11C 11/5685 257/295 |
| 6,927,411 B2 | 8/2005 | Kozicki | |
| 7,101,728 B2 | 9/2006 | Kozicki et al. | |
| 7,106,614 B2 | 9/2006 | Symanczyk | |
| 7,372,065 B2 | 5/2008 | Kozicki et al. | |
| 7,728,322 B2 | 6/2010 | Kozicki | |
| 8,481,989 B2* | 7/2013 | Kai | H01L 27/2409 257/2 |
| 8,937,830 B2* | 1/2015 | Sakamoto | G11C 13/0023 365/148 |
| 2003/0016553 A1* | 1/2003 | Subramanian | G11C 11/5692 365/103 |
| 2009/0052225 A1* | 2/2009 | Morimoto | G11C 11/15 365/148 |
| 2009/0257271 A1* | 10/2009 | Noshiro | H01L 27/101 365/148 |
| 2011/0205781 A1 | 8/2011 | Nakai et al. | |

* cited by examiner

*Primary Examiner* — Mark Prenty

(57) ABSTRACT

A memory device can include a plurality of memory cells formed over a substrate, each memory cell including a tunnel access device that enables current flow in at least one direction predominantly due to tunneling, and a storage element programmable between different impedance states by a reduction-oxidation reaction within at least one memory layer formed between two electrodes; wherein the tunneling access device and programmable impedance element are vertically stacked over one another.

19 Claims, 11 Drawing Sheets

US 9,391,270 B1

MEMORY CELLS WITH VERTICALLY INTEGRATED TUNNEL ACCESS DEVICE AND PROGRAMMABLE IMPEDANCE ELEMENT

TECHNICAL FIELD

The present disclosure relates generally to memory devices, and more particularly to memory devices having storage elements that are programmed between different impedance states.

BACKGROUND

There is a need to store information for long periods of time without the use of power. For example, in many electronic devices and systems, data can be stored in a nonvolatile memory, or quasi-nonvolatile memory. A quasi-nonvolatile memory can be a memory with a 'refresh' interval orders of magnitude longer than a dynamic random access memory (DRAM).

One type of memory is a conductive bridging random access memory (CBRAM). A CBRAM can have memory elements that store information in terms of the resistance level of two-terminal structure. Changes in resistance can come about by a reduction-oxidation reaction of one or more memory layers caused by the application of bias voltages.

Conventionally, nonvolatile memory cells utilize access devices formed in a substrate. For example, "flash" electrically erasable and programmable read only memory (EEPROM) cells can include one or more transistors formed in a substrate that store data by the presence of charge on a floating gate. Thus, substrate area must be dedicated to such memory cells. Flash EEPROMs can also require specialized fabrication processes. While conventional CBRAM based memories can form storage elements over a substrate, such elements are accessed by access devices formed in a substrate (e.g., silicon based transistors, diodes, thyristors, etc.).

DETAILED DESCRIPTION

Figure 1:
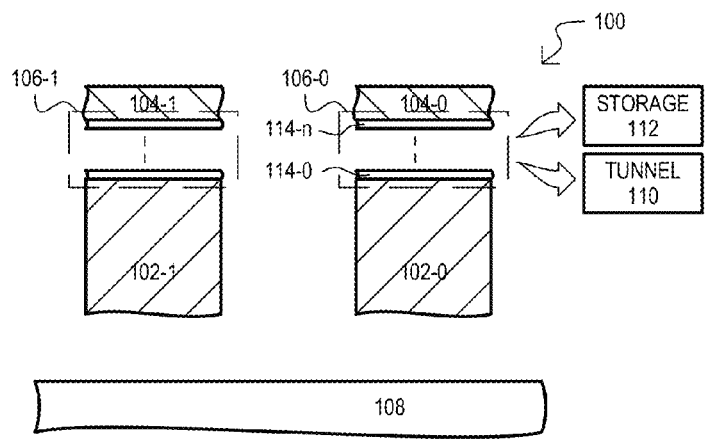
FIG. 1 is a side cross sectional view of a memory device according to an embodiment.

According to embodiments, a memory device can include memory cells that include a vertically integrated tunnel access device and storage element, all formed over a substrate. In some embodiments, a storage element can be a two terminal element having a memory layer programmable between different impedance states by way of a reduction-oxidation (redox) reaction. In particular embodiments, a tunnel access device can be a tunnel diode or tunnel transistor and a storage element can be a conductive bridging random access memory (CBRAM) type element.

According to embodiments, a tunnel access device can be advantageously formed on top of a contact structure (e.g., contact or via) by a number of vertically stacked layers. The corresponding storage element can be formed, or completed by additional vertically stacked layers. In this way, memory cells with both access devices and storage elements can be formed on top of contact structures, for a compact memory array that requires no additional substrate area.

In the embodiments disclosed herein, like sections are referred to by the same reference character but with the leading digit(s) corresponding to the figure number.

FIG. 1 is a side cross sectional representation of a memory device 100 according to an embodiment. A memory device 100 can include a number of bottom electrodes 102-0/1, top conductive plates 104-0/1, and memory cells 106-0/1. Memory cells 106-0/1 can be formed between each bottom electrode 102-0/1 and a corresponding plate 104-0/1. It is understood that bottom electrodes 102-0/1, memory cells 106-0/1 and plates 104-0/1 can be formed above a substrate 108. In some embodiments, a substrate 108 can be the substrate of an integrated circuit device that includes various circuit elements, such as transistors, for example.

Referring still to FIG. 1, as shown by memory cell 106-0, each memory cell 106-0/1 can include a tunnel access device 110 and a storage element 112. A tunnel access device 110 can be enabled to pass current, predominantly by tunneling, through storage element 112 in at least one direction. As will be described in other embodiments below, a tunnel access device 110 can be, but is not limited to, a tunnel diode or tunnel transistor. Storage element 112 can be programmed between different impedance states via a redox reaction. This can include, but is not limited to, the ion conduction within a memory material. In particular embodiments, a storage element 112 can be a CBRAM type element.

According to embodiments, tunnel access device 110 and storage element 112 can be vertically stacked with one another. In some embodiments, storage element 112 can be formed over tunnel access device 110, however, in alternate embodiments, such vertical positions can be switched.

Memory cells 106-0/1 can be formed by a number of vertically stacked layers 114-0 to 114-n. Such layers (114-0 to 114-n) can include insulating layers, conductive (or semiconductive) layers, and one or more memory layers. Memory layer(s) can be layers which, alone or in combination, can be programmed between different impedance states by application of a voltage and/or current that induces a redox reaction within one of the memory layers. In particular embodiments, a tunnel access device 110 and storage element 112 can share structures. For example, one or more of layers (114-0 to 114-n) can be a conductive layer that functions as a common electrode (or terminal) for both the tunnel access device 110 and the storage element 112.

According to embodiments, bottom electrodes 102-0/1 can each correspond to a different memory cell (i.e., bottom electrode 102-0 corresponds to memory cell 106-0, bottom electrode 102-1 corresponds to memory cell 106-1). A bottom electrode 102-0/1 can be formed, in part or in whole, by a vertical interconnect structure of an integrated circuit, including but not limited to a contact or via. In particular embodiments, bottom electrodes 102-0/1 can be "plugs" that can form a conductive path between interconnect layers at different vertical levels.

However, other structures can be layers common to multiple memory cells (106-0/1). For example, any of layers (114-0 to 114-n) can be common to multiple cells (i.e., extend horizontally over multiple bottom contacts 102-0/1). Similarly, plates 104-0/1 can be common to multiple memory cells (i.e., plate 104-0 and 104-1 can be the same structure).

In this way, memory cells having a tunnel access device and storage element can be formed on individual bottom electrodes.

Figure 2A:
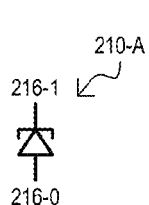
FIGS. 2A to 2C are schematic diagrams of tunnel diode access devices that can be included in embodiments.
Figure 2B:
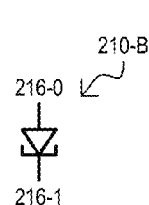
Figure 2C:
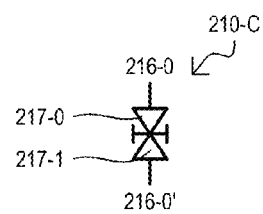
Figure 3A:
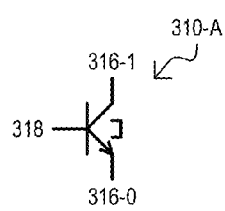
FIGS. 3A to 3D are schematic diagrams of tunnel transistor access devices that can be included in embodiments.
Figure 3B:
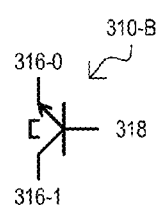
Figure 3C:
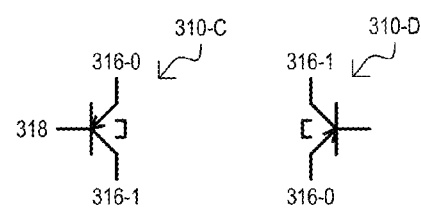
Figure 3D:
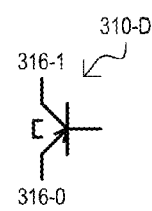

FIGS. 2A to 2C show examples of tunnel access devices that can be included in embodiments. FIGS. 2A to 2C show the use of diodes as tunnel access devices. In FIGS. 2A to 2C it is understood that a top terminal can be connected to a storage element (e.g., 112). Accordingly, FIG. 2A shows a tunnel diode 210-A with an anode 216-0 and cathode 216-1, with the cathode 216-1 connected to a storage element. FIG. 2B shows a tunnel diode 210-B with an anode 216-0 connected to a storage element. In FIGS. 2A and 2B, it is understood that once a reverse bias (anode at a lower potential than cathode) voltage exceeds a threshold voltage, a current can start to flow through the tunnel diode 210-A/B that is predominantly due to tunneling. In contrast, in some arrangements, once a forward bias (anode higher potential than cathode) reaches a turn-on voltage (typically less than the threshold voltage), a current can start to flow through the tunnel diode 210-A/B in the other direction. However, between the turn-on and threshold voltages, current can be prevented from flowing through the memory element. Turn-on and threshold voltages can be set according to dielectric properties (e.g., material, thickness, etc.).

In particular embodiments, a threshold voltage can be greater than a programming voltage of the corresponding memory storage element.

FIG. 2C shows a tunnel diode configuration 210-C having tunnel diodes 217-0/1 with commonly connected cathodes. Anode 216-0 can be connected to a memory element, while anode 216-0' can form an opposing terminal. When a voltage from anode 216-0 to anode 216-0' exceeds a threshold voltage of tunnel diode 217-1, a predominantly tunneling current can flow. Conversely, when a voltage from anode 216-0' to anode 216-0 exceeds a threshold voltage of tunnel diode 217-0, a predominantly tunneling current can flow. It is noted that the materials of tunnel diodes 217-0/1 can be selected to arrive at desired threshold voltages and current responses. Accordingly, an asymmetric voltage response can be achieved so that it takes a greater bias to induce a current in one direction as opposed to the other direction.

FIGS. 3A to 3D show additional examples of tunnel access devices that can be included in embodiments. FIGS. 3A to 3D show tunnel transistors that can be used as access devices. In FIGS. 3A to 3D it is understood that a top terminal can be connected to a storage element (e.g., 112). Accordingly, in FIG. 3A terminal 316-1 of tunnel transistor 310-A can be connected to a storage element, in FIG. 3B terminal 316-0 of tunnel transistor 310-B, etc. Each tunnel transistor (310-A to 310-D) can have a first terminal 316-0, second terminal 316-1, and control terminal 318. A current flow, which can be a predominantly tunneling current, between a first terminal 316-0 and a second terminal 316-1 can be controlled according to a state of the control terminal 318. It is understood that a state of a control terminal 318 can include a high impedance state, as well as an applied voltage.

Figure 4A:
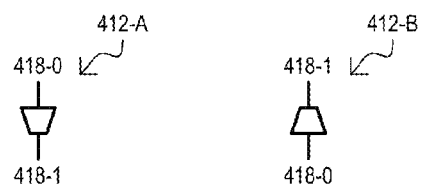
FIGS. 4A and 4B are schematic diagrams of storage elements that can be included in embodiments.
Figure 4B:
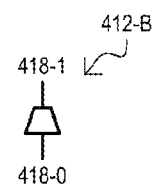

FIGS. 4A and 4B show examples of storage elements that can be included in embodiments. FIGS. 4A and 4B show CBRAM type elements 412-A/B. In FIGS. 4A and 4B it is understood that a bottom terminal can be connected to a tunnel access device (e.g., 110). Accordingly, FIG. 4A shows a CBRAM type element 412-A with an anode 418-0 and cathode 418-1, with the anode 418-0 being connected to a tunnel access device. Conversely, FIG. 4B shows a CBRAM type element 412-B with a cathode 418-1 connected to a tunnel access device.

CBRAM type elements 412-A/B can include one or more memory layers that are programmable between different impedance states due to a redox type reaction. In particular embodiments, an anode 418-1 can be formed of one or more elements which, under bias, can ionize and ion conduct into a "switching" layer, to thereby alter a switching layer impedance. However, alternate embodiments could include storage elements of different types that are programmable via a current flow and/or application of voltage by operation of the corresponding tunnel access device.

Figure 5A:
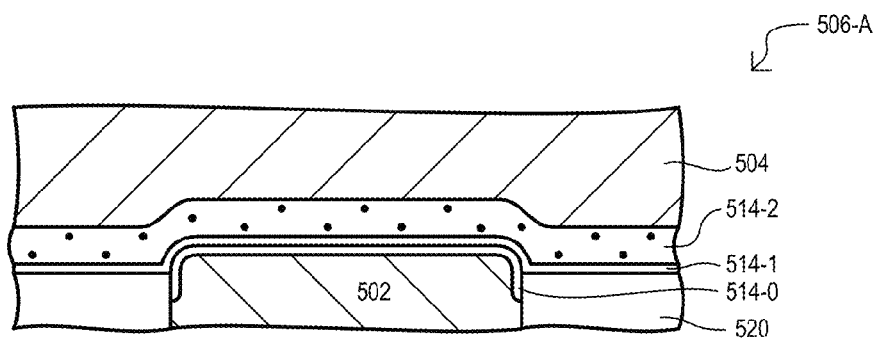
FIGS. 5A to 5C are side cross sectional views of memory cells according to embodiments.

FIG. 5A shows a memory cell 506-A according an embodiment. A memory cell 506-A can include a bottom electrode 502, a conductive plate 504, and a number of layers 514-0 to 514-2 formed between. Layers (514-0 to 514-2) can be vertically stacked with respect to one another. In combination with bottom electrode 502 and conductive plate 504, layers (514-0 to 514-2) can form a tunnel access device and a storage element. It is understood that memory cell 506-A can be formed over a substrate.

A bottom electrode 502 can be formed in an insulating layer 520, and as described for other embodiments herein, can be a contact or via type structure, including a plug. In very particular embodiments, a bottom electrode 502 can be formed of titanium (Ti), titanium nitride (TiN) tungsten (W), tantalum (Ta), tantalum nitride (TaN), platinum (Pt), gold (Au) or aluminum (Al), as but a few examples.

According to embodiments, layers 514-0 and 514-1 can be different insulating layers. In some embodiments, layers 514-0/1 can be different metal oxide layers. A first metal oxide layer 514-0 can be an oxide formed by oxidizing bottom electrode 502. First metal oxide layer 514-0 can have a substantially uniform composition, or one that varies over the thickness. Second metal oxide layer 514-1 can be a deposited layer formed over, and in contact with, the first oxide layer 514-0. In a very particular embodiment, a first metal oxide layer 514-0 can include tantalum oxide (TaOx) formed by oxidizing a tantalum bottom electrode 502, and a second metal oxide 514-1 can be aluminum oxide (AlOx). In another embodiment, a first metal oxide layer 514-0 can include zirconium oxide (ZrOx) and a bottom electrode 502 can be zirconium. In a particular embodiment, the ZrOx layer can be formed by oxidizing a bottom electrode of Zr.

In FIG. 5A, layer 514-2 can include one or more memory layers. Accordingly, layer 514-2 can be programmable between two or more impedance states. In particular embodiments, a memory layer 514-2 can be programmed between different resistance values by application of an electric field. In particular embodiments, a memory layer can include a metal and chalcogen. In one very particular embodiment, a memory layer 514-2 can be a zirconium tellurium combination (ZrTe). As noted above, a layer 514-2 can include multiple layers, one or more of which can be programmed between different impedance values via a redox reaction. For example, in other embodiments, layer 514-2 can include metal oxide layers in which ions can conduct to vary an impedance. Further, layer 514-2 can also include a conductive electrode layer.

A conductive plate 504 can be formed over layers 514-0 to 514-2. It is understood that a conductive plate 504 can include more than one layer. In one very particular embodiment, a conductive plate 504 can include a layer of Ti covered with a layer TiN.

Figure 5B:
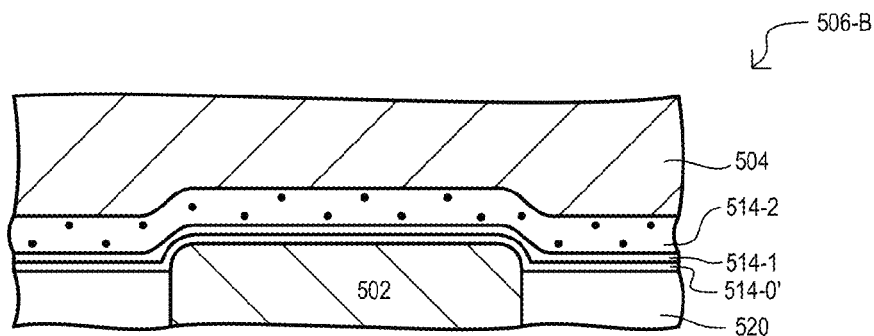

FIG. 5B shows a memory cell 506-B according another embodiment. A memory cell 506-B can include items like those of FIG. 5A. Such items can be formed of the same materials and subject to the same variation as shown in FIG. 5A. However, unlike FIG. 5A in the memory cell 506-B, layer 514-0' can be a deposited layer, not a layer formed by oxidizing a bottom electrode 502.

Figure 5C:
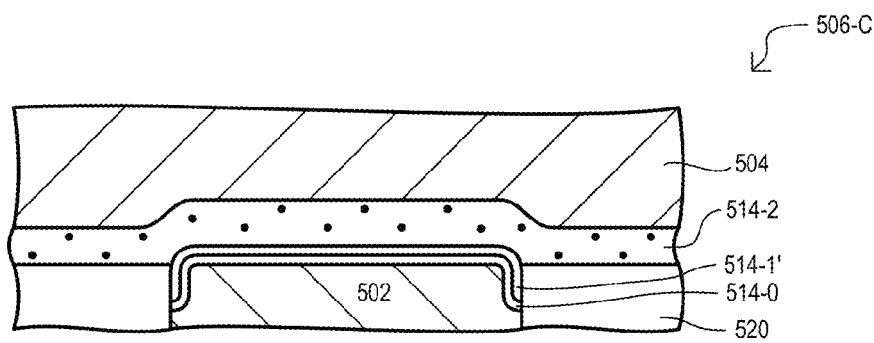

FIG. 5C shows a memory cell 506-C according another embodiment. A memory cell 506-C can include items like those of FIG. 5A. Such items can be formed of the same materials and subject to the same variation as shown in FIG. 5A. However, unlike FIG. 5A in the memory cell 506-B, both layers 514-0 and 514-1' can be formed by oxidizing bottom electrode 502. In particular embodiments, first oxidizing conditions can be applied to form layer 514-0 then second oxidizing conditions can be applied to form layer 514-1'.

As noted above, according to embodiments herein, an access device can be used to access a vertically integrated storage element, to enable current to flow through the storage element and/or a voltage to be applied to the storage element to detect its impedance (i.e., read operation). Alternatively, such a current can be a greater magnitude (and direction) to set the impedance of the storage element to a particular value (e.g., program to a low resistance, erase to a high resistance).

Figure 6:
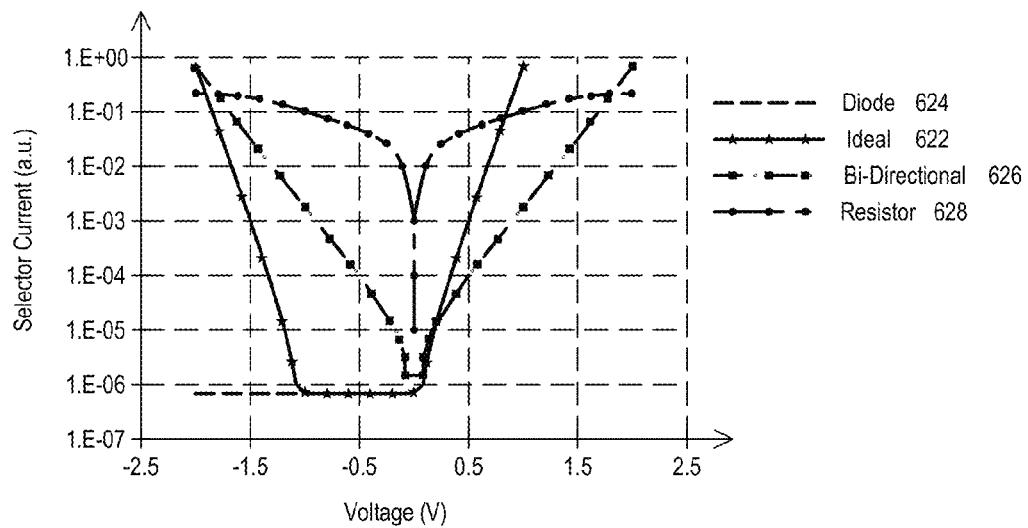
FIG. 6 is a graph of different circuit element responses to show a desired access device response.

FIG. 6 is a graph showing responses of various access devices for a memory cell. FIG. 6 shows a current versus voltage response. A voltage can be the voltage applied across terminals of an access device, and a current can be a current flowing through the access device. FIG. 6 shows an ideal response 622, an ideal diode response 624, a bi-directional response 626, and a resistor response 628. As shown, if a diode response 624 had a threshold voltage response (i.e., increase in current in the negative voltage direction) it could closely follow an ideal access device response. Accordingly, a tunnel diode type access device can serve as an access device. It is understood that a tunnel diode response can be varied according to selection of material type and thickness, in a vertically integrated case.

Figure 7:
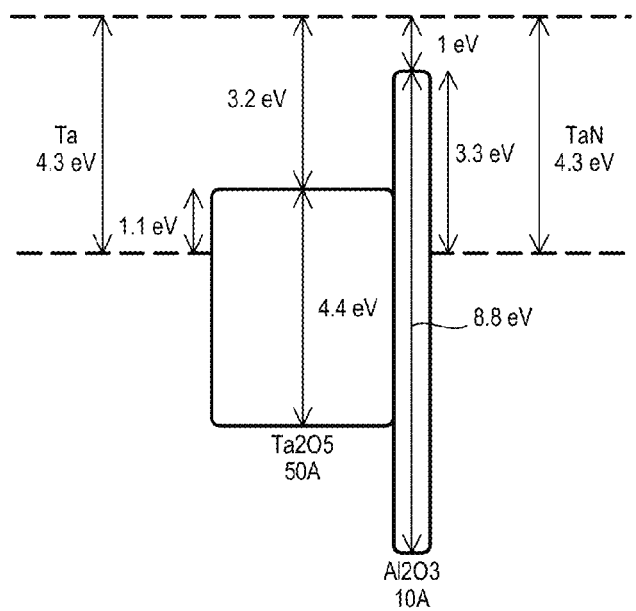
FIG. 7 is a band diagram of a tunnel diode access device that can be included in embodiments.

FIG. 7 is a band diagram showing one example of a tunnel diode that can be included in embodiments. The tunnel diode can include metal oxide layers $Ta_2O_5$ and $Al_2O_3$ formed between Ta and tantalum nitride (TaN) electrodes. In the particular example shown, the layer of $Ta_2O_5$ can have a thickness of 50 angstroms (Å) and the layer of $Al_2O_3$ can have a thickness of 10 Å. Of course, layer thicknesses can be varied to arrive at different threshold responses. In one embodiment, Ta can be a bottom electrode and TaN can be an overlying conductive plate, with layers of $Ta_2O_5$ and $Al_2O_3$ vertically stacked in between.

Figure 8A:
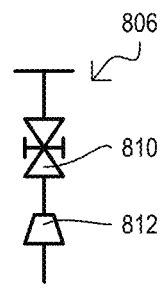
FIG. 8A is a schematic diagram of a memory cell according to an embodiment.
Figure 8B:
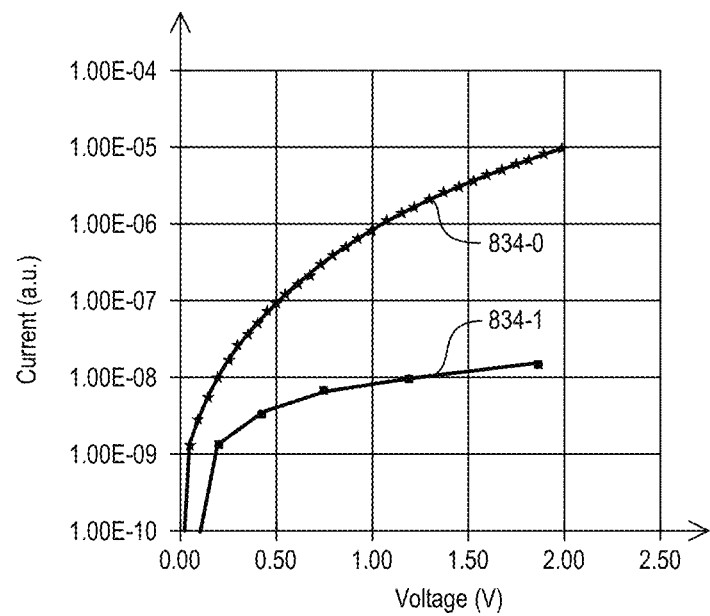
FIG. 8B is a graph of simulation results of read operations for a memory cell like that of FIG. 8A.

FIGS. 8A and 8B are diagrams showing read operation simulation results for a memory cell having a tunnel diode access device and CBRAM type element. FIG. 8A shows the memory cell 806 of the simulation that includes a tunnel diode selector 810 and CBRAM element 812. In the example shown, tunnel diode selector 810 was formed by a layer of gadolinium oxide (GdOx) of 20 Å and a layer of tantalum oxide (TaOx) of 50 Å formed between two electrodes.

FIG. 8B is a graph showing responses of memory cell 806 in a read operation. FIG. 8B shows a current resulting from an applied voltage for a CBRAM in a low resistance state (LRS) 834-0 (Ion) and a high resistance state (HRS) 834-1 (Ioff).

As shown, at a sense voltage of 1.0V, an Ion/Ioff ratio of 100 can be achieved, for a high sensing margin.

Figure 9A:
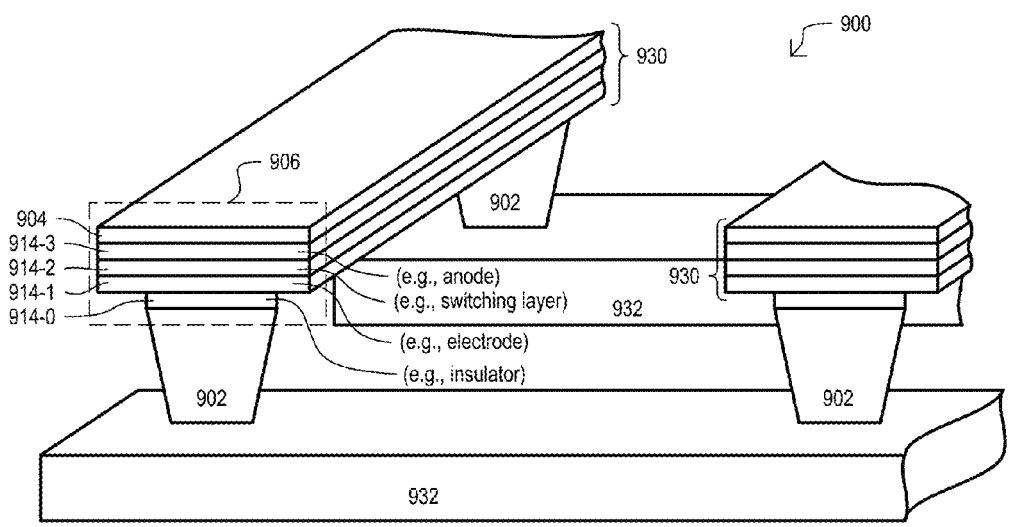
FIG. 9A is an isometric view of a memory device according to an embodiment.
Figure 9B:
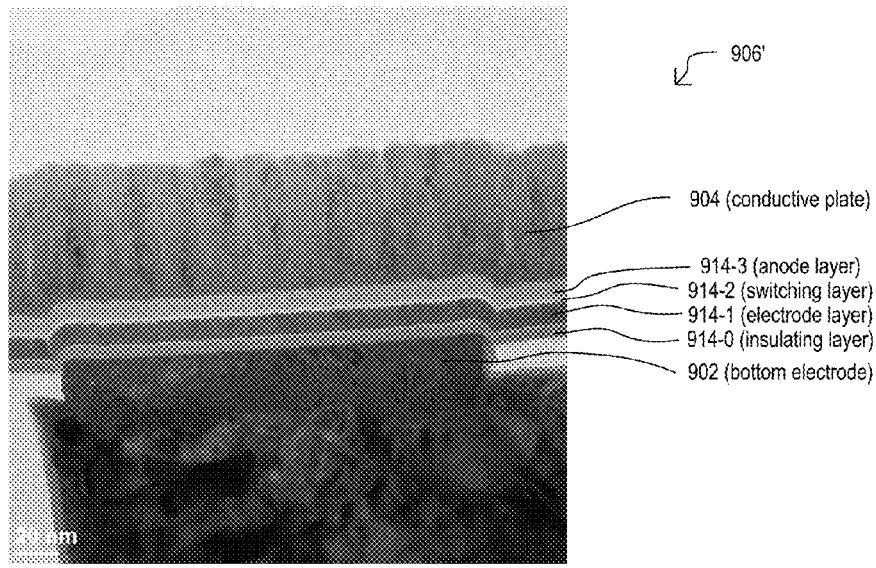
FIG. 9B is a transmission electron microscope micrograph showing a cross section of a memory cell that can included in a memory device like that of FIG. 9A.

According to some embodiments, memory cells with tunnel access devices and storage elements can form arrays for compactly storing large numbers of data values. One such embodiment is shown in FIGS. 9A and 9B. FIG. 9A is an isometric view of a memory device 900. FIG. 9B is a transmission electron microscope (TEM) micrograph cross section of a memory cell that can be included in an embodiment like that of FIG. 9A.

Referring to FIG. 9A, a memory device 900 can include a number of bottom electrodes 902, lower interconnect structures 932, and plate stacks 930. Lower interconnect structures 932 can be disposed in a first direction, while plate stacks 930 can be disposed in a second direction, which in some embodiments, can be generally perpendicular to the first direction. Bottom electrodes 902 can be formed at the intersection of each plate stack 930 and lower interconnect structure 932 (when viewed from the top).

Memory cells (one shown as 906) can be formed by each bottom electrode 902 and a number of overlying layers (914-0 to 914-3) and a conductive plate 904 included within each plate stack 930. In the embodiment shown, layer 914-0 can be formed only on a top surface of the corresponding bottom electrode 902, however, in other embodiments, such a layer could be part of a plate stack. Further, while FIG. 9A shows each plate stack 930 with layers 914-1 to 914-3, in other embodiments, any or all of such layers may not follow the shape of the conductive plate 904. For example, any of layers 914-1 to 914-3 can be separate structures, formed over only one bottom electrodes 902 or a smaller number of bottom electrodes than a conductive plate 904. Conversely, any of layers 914-1 to 914-3 can be formed over a greater number of bottom electrodes than a conductive plate 904.

In one embodiment, layer 914-0 can be an insulating layer, layer 914-1 can be an electrode layer, layer 914-2 can be a switching layer, and layer 914-3 can be an anode layer. Insulating layer 914-0 can include one or more insulating layers disposed between bottom electrode 902 and electrode layer 914-1 to form a tunnel diode as described herein. Insulating layer 914-0 can be formed on a top surface of bottom electrode 902 according to any of the embodiments described herein, or equivalents.

Anode layer 914-3 and switching layer 914-2 can form a memory layer. In particular embodiments, anode layer 914-3 can include one or more metals that can ion conduct within the anode layer 914-3 and/or the switching layer 914-2. Switching layer 914-2 can be programmed between different impedance states by one or more redox reactions. In some embodiments, this can include the ion conduction of species from the anode layer 914-3 into the switching layer 914-2. In addition or alternatively, other redox reactions within the switching layer 914-2 can result in a reversible changed in impedance. In very particular embodiments, anode layer 914-3 can include a chalcogen and metal, while a switching layer can be metal oxide.

Conductive plates 904 can be a conductive layers that are oriented a different directions than interconnect structures 932. In such an arrangement, each memory cell 906 can be formed between a different plate layer 904/interconnect structure 932.

By situating memory cells 906 between different plate layer 904/interconnect structure 932 pairs, selection of individual memory cells 906 for reading and programming operations can be possible. In such operations a potential can be developed between the plate layer 904 (or corresponding plate stack 930) and interconnect structure 932 of a memory cell 906 that is sufficient to enable current to flow through the tunnel diode. This can include exceeding the threshold voltage(s) of the tunnel diode. For read operations, a resulting current or voltage is not sufficient to program the device. However, in program operations, the voltage/current will be sufficient to program the device. In very particular embodiments, a switching layer 914-2 can be programmed to a low resistance via a current/voltage in one direction, and erased to a high resistance via a current/voltage in the opposite direction. At the same time one memory cell 906 is selected for reading or programming, other memory cells can be de-selected by ensuring that the voltage between their corresponding plate layer 904/interconnect structure 932 is not sufficient to enable current to flow through the tunnel diode. As noted previously, desired threshold voltages and currents can be established by selection of tunnel diode materials and thicknesses.

FIG. 9B shows one example of a memory cell like that of FIG. 9A in a side cross sectional view. FIG. 9B shows a memory cell having a tantalum bottom electrode 902, a metal oxide layer 914-0, an electrode layer 914-1, a switching layer 914-2, an anode layer 914-3, and a TaN conductive plate 904.

Figure 10A:
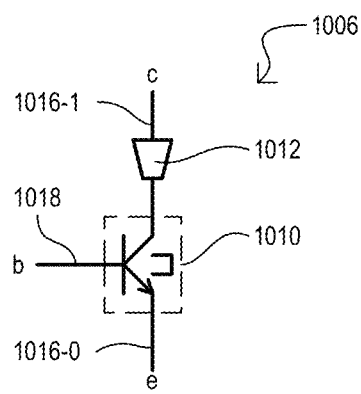
FIG. 10A is a schematic diagram of a memory cell according to an embodiment.
Figure 10B:
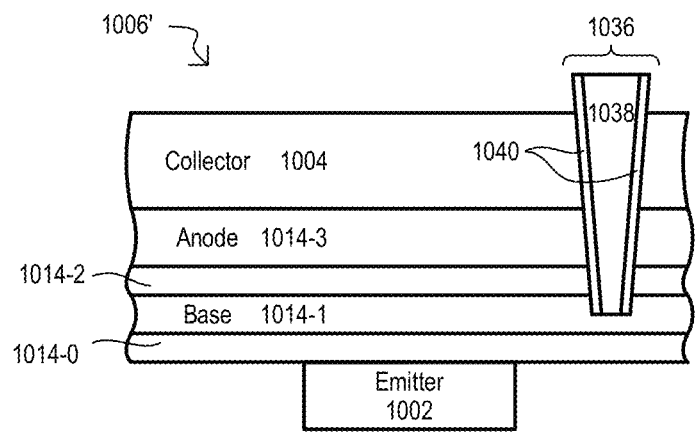
FIG. 10B is a side cross sectional view of one implementation of the memory cell shown in FIG. 10A.

While embodiments can include tunnel diodes as vertically integrated access devices, other embodiments can include tunnel transistors. Examples of such embodiments are shown in FIGS. 10A and 10B. FIG. 10A is a schematic diagram of a memory cell 1006 according to an embodiment. Memory cell 1006 can include a tunnel transistor 1010 integrated with a storage element 1012. Memory cell 1006 can be conceptualized as having a first terminal 1016-0, second terminal 1016-1 and control terminal 1018. Such terminals are referred to as an emitter (e), collector (c) and base (b), respectively. In operation, according to a state of control terminal 1018, a current can be enabled to flow between first terminal 1016-0 and second terminal 1016-1. In some embodiments, a current flow in one direction, can result in a programming of storage element 1016-1 to one state (e.g., high resistance), while a current flow in the other direction can result in a programming of storage element 1016-1 to another state (e.g., low resistance). A smaller current in one of the directions can be used to sense the impedance state of storage element 1012.

FIG. 10B is a side cross sectional view of one implementation of a memory cell 1006' such as that shown in FIG. 10A. A memory cell 1006' can include a bottom electrode 1002 a conductive plate 1004, and a number of layers 1014-0 to 1014-3 vertically stacked in between. Bottom electrode 1002 can serve as a first terminal (emitter). Layer 1014-0 can be an insulating layer, such as one or more metal oxides, for example, which can serve as a tunneling layer (e.g., layer that creates the tunneling current threshold voltage). Layer 1014-1 can be an electrode layer, which can serve as a control terminal (base). Layer 1014-2 can be a switching layer as described for embodiments herein, and equivalents. Layer 1014-3 can be an anode layer as described for embodiments herein, and equivalents. Conductive plate 1004 can serve as a second terminal (collector).

In the particular embodiment shown, memory cell 1006' can include an electrode tap 1036 which enables an electrical connection to electrode layer 1014-1 (base). Electrode tap 1036 can include a conductive portion 1038 and insulating sidewall portions 1040. Accordingly, a state (i.e., potential or high impedance state) of the control electrode (base) 1014-1 can be established via electrode tap 1036.

It is understood that FIGS. 10A and 10B show particular memory cell configurations, and alternate embodiments can include various other configurations, including those described with reference to FIGS. 2A to 4B.

Memory cells like those shown in FIGS. 10A and 10B can be arranged into arrays, which can be formed over a substrate of an integrated circuit. This can enable dense, nonvolatile memory arrays to be created at a "back end" of an integrated circuit fabrication process. Such memory arrays can require substantially no substrate area apart from circuits for driving conductive lines that control access to the memory cells of the array.

Figure 11A:
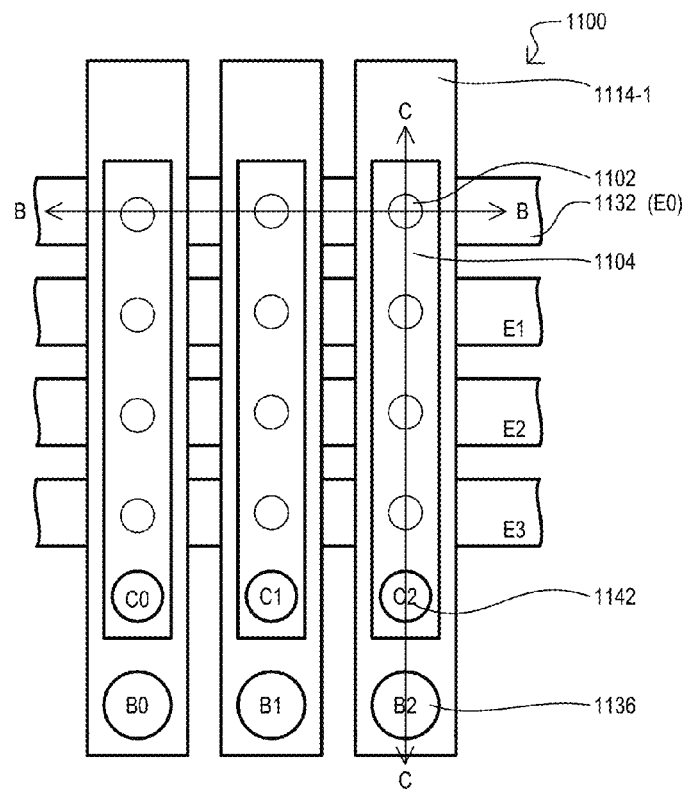
FIGS. 11A to 11C are a series of diagrams showing a memory cell according to an embodiment.
Figure 11B:
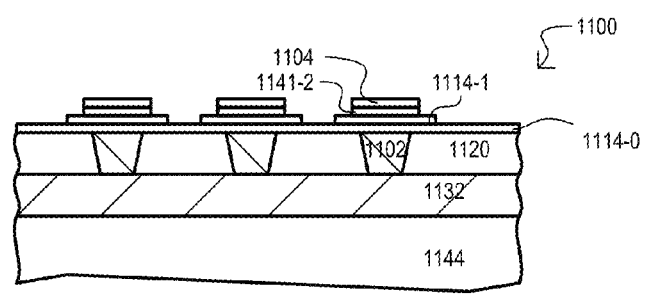
Figure 11C:
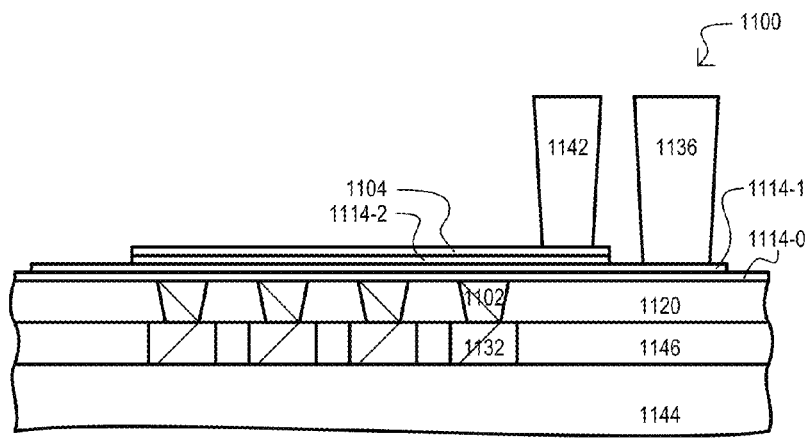

An integrated circuit device 1100 according to one embodiment is shown in FIGS. 11A to 11C. FIG. 11A is a top plan view. FIG. 11B is a side cross sectional view taken along the plane B-B of FIG. 11A. FIG. 11C is a side cross sectional view taken along the plane C-C of FIG. 11A.

Referring to FIG. 11A, a memory device 1100 can include a number of lower interconnect structures (one shown as 1132) arranged in one direction (horizontal in FIG. 11A). Interconnect structures 1132 can be conductively connected to bottom electrodes (one shown as 1102), which serve as first terminals (e.g., emitters) for memory cells of a row. Accordingly, the interconnect structures 1132 can be conceptualized as being emitter lines E0, E1, E2 and E3, common to memory cells of a same column.

Control electrodes (one shown as 1114-1) can be formed over, and arranged in a different direction than interconnect structures 1132. In FIG. 11A, control electrodes 1114-1 can extend in a vertical direction. A state of each control electrode 1014-1 can be established by a corresponding control electrode tap (one shown as 1136). Control electrodes 1114-1 can be conceptualized as being base lines B0, B1 and B2 common to memory cells of a same row.

A conductive plate (one shown as 1104) can be formed over each control electrode 1114-1. A state of each conductive plate 1104 can be established by a corresponding control electrode tap (one shown as 1142). Conductive plates 1104 can be conceptualized as being collector lines C0, C1 and C2 common to memory cells of a same row.

Bottom electrodes (one shown as 1102) can be formed at the intersection of each lower interconnect structure 1132 and conductive plate 1104. Consequently, a memory cell can be formed at each such intersection by the vertical layers formed over the corresponding bottom electrode 1102.

Referring to FIG. 11B, lower interconnect structures 1132 can be formed on an insulating layer 1144. It is understood that insulating layer 1144 can be formed over a substrate (not shown). Bottom electrodes 1102 can be formed in an insulating layer 1120. Further, a layer 1114-0 can be formed between each bottom electrode 1102 and the corresponding control electrode 1114-1. A layer 1114-0 can include one or more insulating layers as described herein, which can create a tunneling barrier for the tunnel transistor. In alternate embodiments, all or a portion of layer 1114-0 can be formed by oxidizing a bottom electrode 1102. A memory layer 1114-2 can be formed between each control electrode 1114-1 and conductive plate 1104. All or a portion of memory layer 1114-2 can be programmable between different impedance state. Memory layer 1114-2 can include multiple layers, as described herein, or equivalents.

Referring to FIG. 11C, in the memory device 1100 shown, control electrodes 1114-1 can extend in a lateral direction beyond memory layer 1114-2 and conductive plate 1104, to provide a landing area for control electrode tap 1136. However, in alternate embodiments, such a tap could extend through various layers, as shown in FIG. 10B.

As will be described in following embodiments, by establishing the states of emitter lines (E0 to E3), collector lines (C0 to C2), and base lines (B0 to B2), memory cells can be selected for read operations (which sense the impedance state of a storage element) and program operations (which establish the impedance state of the storage element).

Figures 12A, 12B:
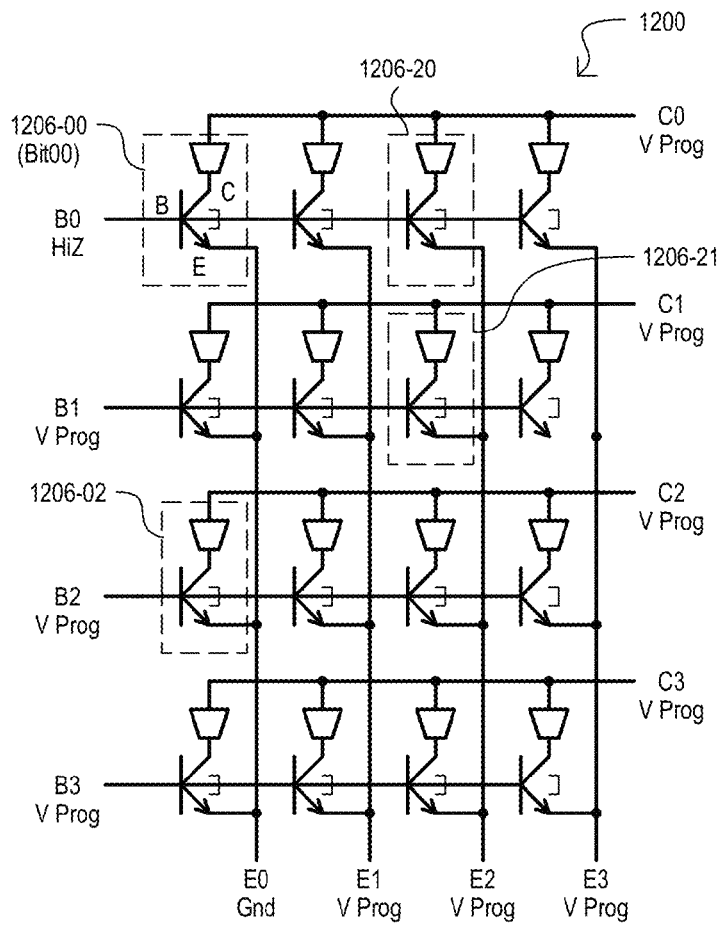
FIG. 12A is a schematic diagram of a memory cell array according to an embodiment.
FIG. 12B is a table showing access operations for a memory cell array like that of FIG. 12A.

FIGS. 12A and 12B are diagrams showing a memory device like that shown in FIGS. 11A to 11C. FIG. 12A is a schematic diagram showing memory device 1200 with memory cells (four shown as 1206-00, -02, -20, -21) like those of FIG. 10A (i.e., include a tunnel transistor and storage element, such as a CBRAM like element). Memory cells of same row (shown in a horizontal direction) can have commonly connected base lines (B0 to B2) and collector lines (C0 to C2). Memory cells of a same column (shown in a vertical direction) can have commonly connected emitter lines (E0 to E3). In a particular embodiment, base lines (B0 to B2), collector lines (C0 to C2) and emitter lines (E0 to E3) can be formed by structures like those shown in FIGS. 11A to 11C. In FIG. 12A, memory cell 1206-00 is assumed to store a data value "Bit 00".

FIG. 12B is table showing the states of base lines (B0 to B2), collector lines (C0 to C2) and emitter lines (E0 to E2) for operations of the memory device 1200. In particular, FIG. 12B shows states for selecting memory cell 1206-00 (i.e., Bit 00) for program, erase, and read operations, while the other memory cells are de-selected.

Referring to FIGS. 12A and 12B, in a programming operation, collector lines (C0 to C2) can be driven to a high voltage (H), a base line of the selected row (B0 in this example), can be placed into a high impedance state, while base lines of unselected rows (B1, B2) can be driven to the high voltage (H). An emitter line of the selected column (E0 in this example), can be driven to a low voltage (L), while emitter lines of unselected columns (E1 to E3) can be driven to the high voltage (H).

In the program operation, in the selected memory cell 1206-00, a potential will be sufficient to cause a tunnel transistor current to flow, programming the corresponding storage element. In one embodiment, such an operation can program a CBRAM type element to a low resistance state. In a memory cell 1206-02 of the same column, but a different row, while its emitter line can be low (E0=L), the corresponding base line (B2) and collector line (C2) can both be high. As a result, there will be no potential difference across the storage element, so the storage element will not be programmed. In a memory cell 1206-20 of the same row, but different column, while the base line (B0) can be in a high impedance state, the emitter and collector lines can both be high (C0=E2=H), thus no current will flow through the memory cell, and the storage element will not be programmed. In a memory cell 1206-21 of a different column and row, all terminals will be at the same voltage (H), thus no current will flow in the memory cell, and the storage element will not be programmed.

As shown by FIG. 12B, read operations can occur in the same fashion as program operations. However, high voltage (H') is at a level sufficient to enable a tunnel transistor current, but not high enough to program the storage element (i.e., H'<<H).

Referring still to FIGS. 12A and 12B, in an erase operation, collector lines (C0 to C2) can be driven to a low voltage (L), a base line of the selected row (B0 in this example), can be placed into a high impedance state, while base lines of unselected rows (B1, B2) can be driven to the low voltage (L). An emitter line of the selected column (E0 in this example), can be driven to a high voltage (H), while emitter lines of unselected columns (E1 to E3) can be driven to the low voltage (L). Within the selected memory cell 1206-00, a potential will be sufficient to cause a tunnel transistor current to flow in a direction opposite to that of the programming operation, resulting in the impedance of the corresponding storage element being changed. In one embodiment, such an operation can erase a CBRAM type element to a high resistance state. In a memory cell 1206-02 of the same column, but a different row, while an emitter line can be high (E0=H), the base (B2) and collector (C2) can both be low, so no potential difference will develop across the storage element. In a memory cell 1206-20 of the same row, but different column, while the base (B0) can be in a high impedance state, the emitter and collector can both be low (C0=E2=H), and no current will flow through the memory cell. In a memory cell 1206-21 of a different column and row, all terminals will be at the same voltage (L), thus no current will flow in the memory cell.

In this way, an array of memory cells having tunnel transistors and storage elements can individually access individual memory cells for read, program and erase operations.

Having described various memory devices, memory cells and methods of operations, methods of manufacturing memory cells according to particular embodiments will now be described.

FIGS. 13A to 13E are a sequence of side cross views showing one method of fabricating a memory cell like that shown in FIG. 5A.

Figure 13A:
FIG. 13A to 13E are a sequence of cross sectional views showing methods of forming a memory cell like that of FIG. 5A.

FIG. 13A shows the formation of an opening 1350 in insulating layer 520. In some embodiments, such an opening 1350 can be formed by etching through the insulating layer to a conductive structure below (e.g., a lower interconnect structure). In particular embodiments, opening 1350 can be minimal achievable contact size, for a very compact memory cell footprint.

Figure 13B:
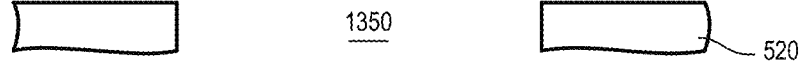

FIG. 13B shows the formation of bottom electrode 502' within opening 1350. In a particular embodiment, this can include forming a "plug". In some embodiments, electrode material(s) can be deposited into the opening 1350 and then a planarization step can planarize the structure. Bottom electrode 502' can formed with any suitable fabrication technique, including but not limited to sputtering, physical vapor deposition (PVD), chemical vapor deposition (CVD) or atomic layer deposition (ALD). Bottom electrode 502' can be formed of any suitable conductive material, or combination of conductive materials. In one very particular embodiment, bottom electrode 502' can be Ta.

Figure 13C:
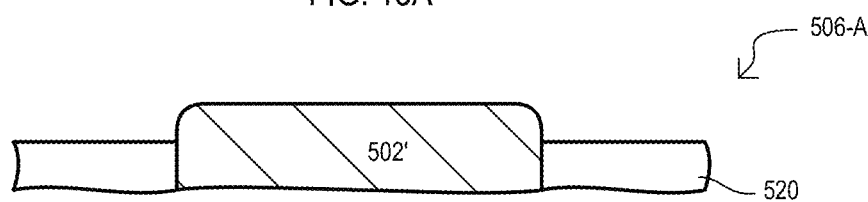

FIG. 13C shows the oxidation of bottom electrode to form bottom electrode 502 covered with a native oxide layer 514-0. Such a step can include a direct in situ oxidation of the bottom electrode 502'. That is, bottom electrode 502' can be exposed to an oxidizing atmosphere to grow an oxide layer of desired thickness and property. However, as will be described with reference to FIG. 13D, oxide layer 514-0 can be formed indirectly while a second insulating layer is being formed. In one very particular embodiment, bottom electrode 502 can be Ta and oxide layer 514-0 can be TaOx.

Figure 13D:
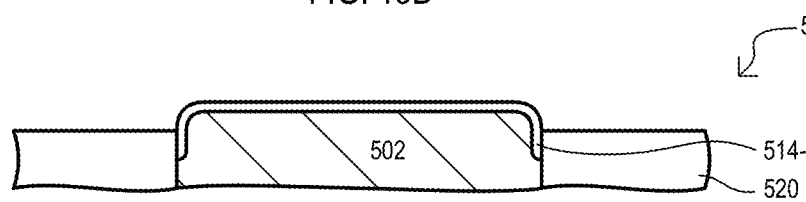

FIG. 13D shows the formation of a second insulating layer 514-1 over oxide layer 514-0. In some embodiments, second insulating layer 514-1 can be formed by depositing a layer after oxide layer 514-0 has been formed. However, in other embodiments, oxide layer 514-0 can be formed as second insulating layer 514-1 is deposited. In one particular embodiment, a second insulating layer 514-1 can be AlOx formed by reactive pulsed DC PVD technique, which can indirectly oxidize a Ta bottom electrode to create a TaOx layer 514-0. The degree to which the bottom electrode 502' is oxidized can be controlled by variables used to form the AlOx, including but not limited to: when and how much oxygen is introduced into the reaction chamber and the interval between plasma ignition and the introduction of oxygen. In one very particular embodiment, a layer of TaOx 514-0 can be formed by the deposition of a layer of AlOx by a DC pulsed PVD deposition with a power of 1000 W, duty cycle of 30%, and pressure of about 5.2 mT at room temperature (RT).

Figure 13E:
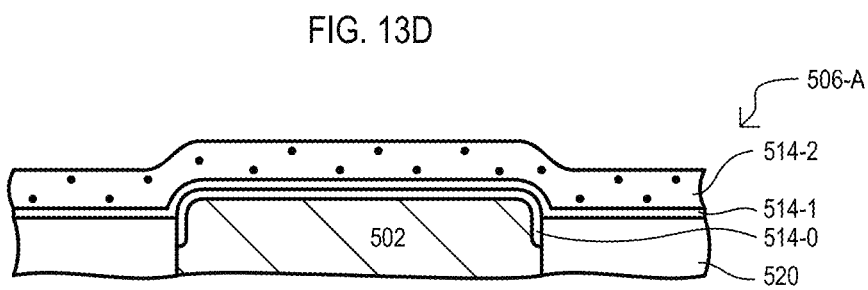

FIG. 13E shows the formation of a memory layer 514-2 over second insulating layer 514-1. A memory layer can have the form of any of those described for embodiments herein, or equivalents, including being composed of multiple layers. In one very particular embodiment, memory layer 514-2 can be a Zr—Te combination (ZrTe) formed by co-sputtering a Zr target and Te target with DC and RF PVD, respectively. The sputtering of the Zr target can be at a power of 13 W, while the sputtering of the Te target can be at a power of 17 W. A pressure can be about 2 mT at RT.

Referring back to FIG. 5A, following the operations of FIG. 13E, a conductive plate 504 can be formed over memory layer 514-2. A conductive plate 504 can be formed of any conductive material(s) suitable for the memory cell structure, materials, and fabrication process used. In one very particular embodiment, a conductive plate 504 can include a 100Å layer of Ta covered with a 500Å layer of TaN. Ta can be deposited with DC PVD at a power of 50 W at a pressure of 2 mT at RT. TaN can be deposited with a nitrogen ($N_2$) and argon (Ar) gas mixture, with an $N_2$ flow of 6 standard cubic centimeters per minute (sccm) and an Ar flow of 19 sccm. Such a TaN layer can be deposited at 150 W with a pressure of about 2 mT at RT.

FIGS. 14A to 14E are a sequence of side cross views showing one method of fabricating a memory cell like that shown in FIG. 5B. FIGS. 14A to 14E include steps like those of FIGS. 13A to 13E, and such steps can be the same, except as noted below.

Figure 14A:
FIG. 14A to 14E are a sequence of cross sectional views showing methods of forming a memory cell like that of FIG. 5B.
Figure 14B:
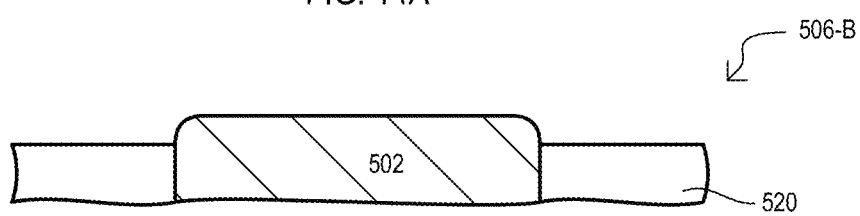
Figure 14C:
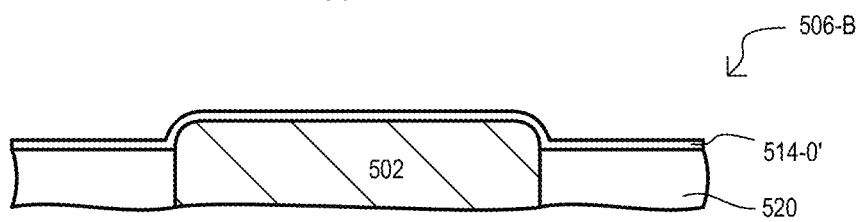
Figure 14D:
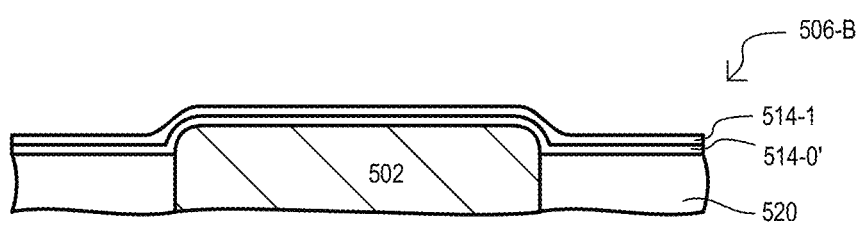
Figure 14E:
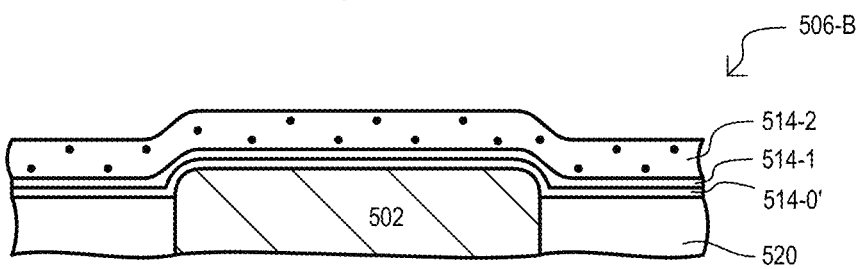

Referring to FIG. 14C, unlike the embodiment of FIGS. 13A to 13E, a first insulating layer 514-0' can be a deposited layer, rather than an oxide layer created by oxidizing a surface of bottom electrode.

FIGS. 15A to 15E are a sequence of side cross views showing one method of fabricating a memory cell like that shown in FIG. 5C. FIGS. 15A to 15E include steps like those of FIGS. 13A to 13E, and such steps can be the same, except as noted below.

Figure 15A:
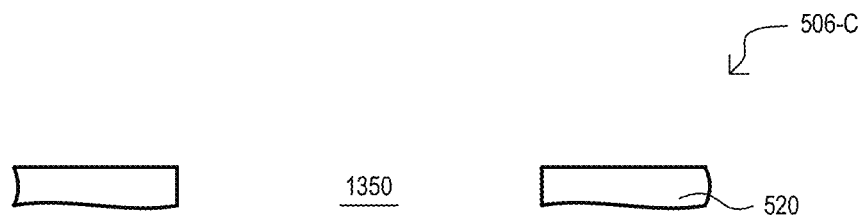
FIG. 15A to 15E are a sequence of cross sectional views showing methods of forming a memory cell like that of FIG. 5C.
Figure 15B:
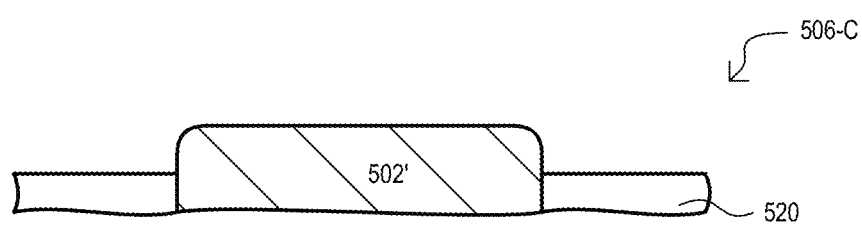
Figure 15C:
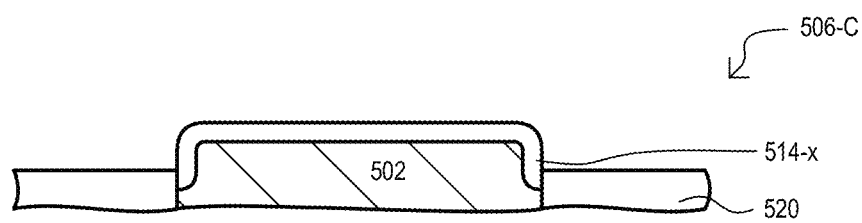
Figure 15D:
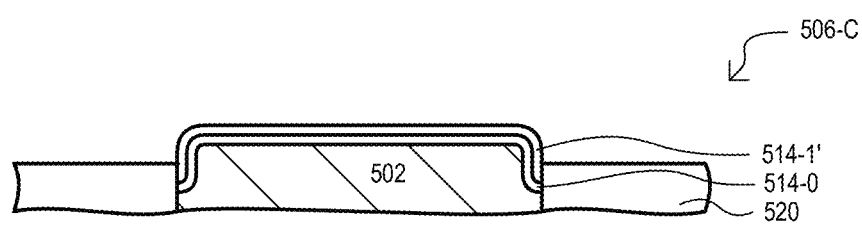
Figure 15E:
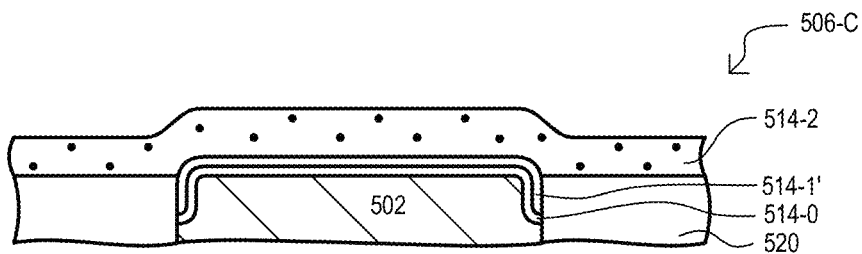

Referring to FIGS. 15C and 15D, unlike the embodiment of FIGS. 13A to 13E, a first insulating layer 514-0 and second insulating layer 514-1' can be formed by oxidizing bottom electrode 502'. In particular embodiments, a bi-layer of a same metal oxide can be created, where the different layers have different stoichiometry. An oxidation process can be varied to create such a bi-layer structure. Process variations can include, but are not limited to: varying an amount of oxygen introduced into the reaction chamber, varying a gas chemistry or conditions during a deposition (e.g., CVD, ALD) process.

Referring to FIG. 15C, first oxidation conditions can form an initial oxide layer 514-x.

Referring to FIG. 15D, second oxidation conditions following the first oxidation conditions can create a bi-layer metal oxide, composed of a metal oxide 514-0 of a first stoichiometry or composition and a metal oxide 514-1' of a second, different stoichiometry or composition.

It is understood that any of the various process actions shown in FIGS. 13A to 15E can be combined or varied. Further, alternate embodiments can include the inclusion of additional layers to arrive at a desired vertically integrated memory cell. That is, the fabrication methods shown are intended as examples, and should not be construed as limiting.

It should be appreciated that reference throughout this description to "one embodiment" or "an embodiment" means that a particular feature, structure or characteristic described in connection with the embodiment is included in at least one embodiment of an invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

It is also understood that other embodiments of this invention may be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A memory device, comprising:
 a plurality of memory cells formed over a substrate, each memory cell including
  a tunnel access device that enables current flow in at least one direction predominantly due to tunneling, the tunnel access device comprising
   a conductive contact structure formed through an insulating layer,
   a first insulating layer formed on the contact structure, and
   a second insulating layer, different from the first insulating layer, formed on the first insulating layer, and
  a storage element programmable between different impedance states by a reduction-oxidation reaction within at least one memory layer formed between two electrodes; wherein
 the tunneling access device and programmable impedance element are vertically stacked over one another.

2. The memory device of claim 1, wherein:
the first insulating layer is an oxidized portion of the conductive contact structure.

3. The memory device of claim 1, wherein:
the tunnel access device comprises a tunnel diode that enables a predominantly tunneling current in one direction under first bias conditions.

4. The memory device of claim 3, wherein:
the tunnel diode is vertically integrated with the storage element, a first electrode of the tunnel transistor forming one electrode of the programmable impedance element.

5. A memory device, comprising:
a plurality of memory cells formed over a substrate, each memory cell including
a tunnel access device that enables current flow in at least one direction predominantly due to tunneling, and
a storage element programmable between different impedance states by a reduction-oxidation reaction within at least one memory layer formed between two electrodes; wherein
the tunneling access device and programmable impedance element are vertically stacked over one another, and
the tunnel access device comprises a tunnel transistor that controls a tunneling current flow between a first electrode and second electrode according to a state of a control electrode.

6. The memory device of claim 5, wherein:
the tunnel transistor is vertically integrated with the storage element, a first electrode of the tunnel transistor forming one electrode of the programmable impedance element.

7. The memory device of claim 6, wherein:
each memory cell includes
a bottom contact that operates as the first electrode of the tunnel transistor,
at least one insulating layer formed on a top surface of the bottom contact,
a first conductive layer formed over the insulating layer that operates as the control electrode of the tunnel transistor,
the at least one memory layer formed over the first conductive layer, and
a second conductive layer formed over the memory layer that operates as the second electrode of the tunnel transistor.

8. The memory device of claim 1, wherein:
the at least one memory layer includes
a switch layer programmable between different impedance states, and
an anode layer in contact with the switch layer comprising at least element that is ion conductible in the switch layer.

9. The memory device of claim 8, wherein:
the anode layer comprises a metal and a chalcogen, and
the switch layer comprises a metal oxide.

10. A memory device, comprising:
a plurality of bottom electrodes;
a plurality of first conductive plates, each first conductive plate formed over a corresponding group of bottom electrodes;
memory cells formed between each bottom electrode and the corresponding conductive plate, each memory cell including
a tunnel access device configured to pass a tunneling current in response to a first bias voltage, and
a storage element programmable between different impedance states by a reduction-oxidation reaction within at least one memory layer; and
a contiguous memory layer section between each first conductive plate and the corresponding group of bottom electrodes, each memory layer section providing the memory layer for the memory cells of its corresponding group of bottom electrodes.

11. The memory device of claim 10, wherein:
each bottom electrode is plug comprising a conductive material selected from the group of tantalum, aluminum, titanium, tungsten, tantalum nitride, and zirconium.

12. The memory device of claim 10, wherein:
the memory layer includes
a switch layer programmable between different impedance states, and
an anode layer in contact with the switch layer comprising at least element that is ion conductible in the switch layer.

13. The memory device of claim 10, further including:
a plurality of lower conductive structures, formed below and electrically connected to, the bottom electrodes, the lower conductive structures being oriented such that each bottom electrode is disposed between a different conductive plate and lower conductive structure.

14. The memory device of claim 10, further including:
the tunnel access device of each memory cell comprises a tunnel diode, having
a first terminal formed by the corresponding bottom electrode,
a second terminal formed by the corresponding first conductive plate,
a first metal oxide formed over the bottom electrode and below the corresponding first conductive plate, and
a second metal oxide, different from the first metal oxide, formed over the first metal oxide and below the corresponding first conductive plate.

15. The memory device of claim 14, wherein:
each storage element is integrated with the corresponding tunnel diode, the memory layer being formed between the second metal oxide and first conductive plate.

16. The memory device of claim 10, wherein:
the tunnel access device of each memory cell comprises a tunnel transistor, having
a first terminal formed by the corresponding bottom electrode,
a second terminal formed by the corresponding first conductive plate, and
a control terminal formed by a control conductive layer formed between each first conductive plate and the corresponding group of bottom electrodes.

17. The memory device of claim 16, wherein:
each storage element is integrated with the corresponding tunnel transistor, the memory layer being formed between the control conductive layer and first conductive plate.

18. The memory device of claim 5, wherein:
the at least one memory layer includes
a switch layer programmable between different impedance states, and
an anode layer in contact with the switch layer comprising at least element that is ion conductible in the switch layer.

19. The memory device of claim 18, wherein:
the anode layer comprises a metal and a chalcogen, and
the switch layer comprises a metal oxide.

* * * * *